(12) United States Patent
Lu et al.

(10) Patent No.: US 8,787,027 B2
(45) Date of Patent: Jul. 22, 2014

(54) MOUNTING APPARATUS FOR CIRCUIT BOARD

(75) Inventors: Wen-Hu Lu, Shenzhen (CN); Zhan-Yang Li, Shenzhen (CN); Po-Wen Chiu, New Taipei (TW)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 240 days.

(21) Appl. No.: 13/406,625

(22) Filed: Feb. 28, 2012

(65) Prior Publication Data
US 2013/0010437 A1 Jan. 10, 2013

(30) Foreign Application Priority Data
Jul. 7, 2011 (CN) .......................... 2011 1 0189552

(51) Int. Cl.
*H05K 5/00* (2006.01)

(52) U.S. Cl.
USPC ............................ 361/752; 361/809; 361/810

(58) Field of Classification Search
USPC ......... 361/752, 728–730, 796, 800–802, 807, 361/809, 810, 747, 759; 174/138 E, 138 G
See application file for complete search history.

(56) References Cited

U.S. PATENT DOCUMENTS

| | | | | |
|---|---|---|---|---|
| 7,052,291 B2* | 5/2006 | Barina et al. | ..................... | 439/92 |
| 7,613,012 B2* | 11/2009 | Hung et al. | ................... | 361/809 |
| 8,434,217 B2* | 5/2013 | Chiu et al. | ....................... | 29/739 |
| 2012/0145723 A1* | 6/2012 | Chiu et al. | ..................... | 220/660 |
| 2013/0205585 A1* | 8/2013 | Chiu et al. | ....................... | 29/745 |

* cited by examiner

*Primary Examiner* — Hung S Bui
(74) *Attorney, Agent, or Firm* — Novak Druce Connolly Bove + Quigg LLP

(57) ABSTRACT

A mounting apparatus for fixing a circuit board having a position block comprises an enclosure having a bottom plate; a first mounting member having a first securing portion, and a second mounting member having a first position portion and a first mounting portion. A first through hole is defined on the bottom plate. A first depressed portion is defined around the first through hole on the bottom plate. A first fixing hole is defined on the first securing portion. The first position portion is received in the first depressed portion to prevent the first position portion rotating relative to the bottom plate. The first mounting portion passes through the first through hole to be fixed in the first fixing hole. The bottom plate is fixed between the first securing portion and the first position portion. The position block engages the position slot to fix the circuit board on the enclosure.

16 Claims, 6 Drawing Sheets

MOUNTING APPARATUS FOR CIRCUIT BOARD

BACKGROUND

1. Technical Field

The present disclosure relates to a mounting apparatus for fixing a circuit board on an electronic device enclosure.

2. Description of Related Art

A typical mounting apparatus may include a screw and a screw nut. A screw includes a head portion and a shaft. The screw nut defines an installation hole. A bottom panel defines a through hole. A circuit board defines a screw hole. In use, the shaft is inserted into the through hole and the screw hole, and engaged into the installation hole to secure the circuit board to the bottom panel. The head portion of the screw abuts the bottom panel. Thus, the head portion may increase the thickness of the bottom panel.

Therefore there is a need for improvement in the art.

DETAILED DESCRIPTION

Figure 1:
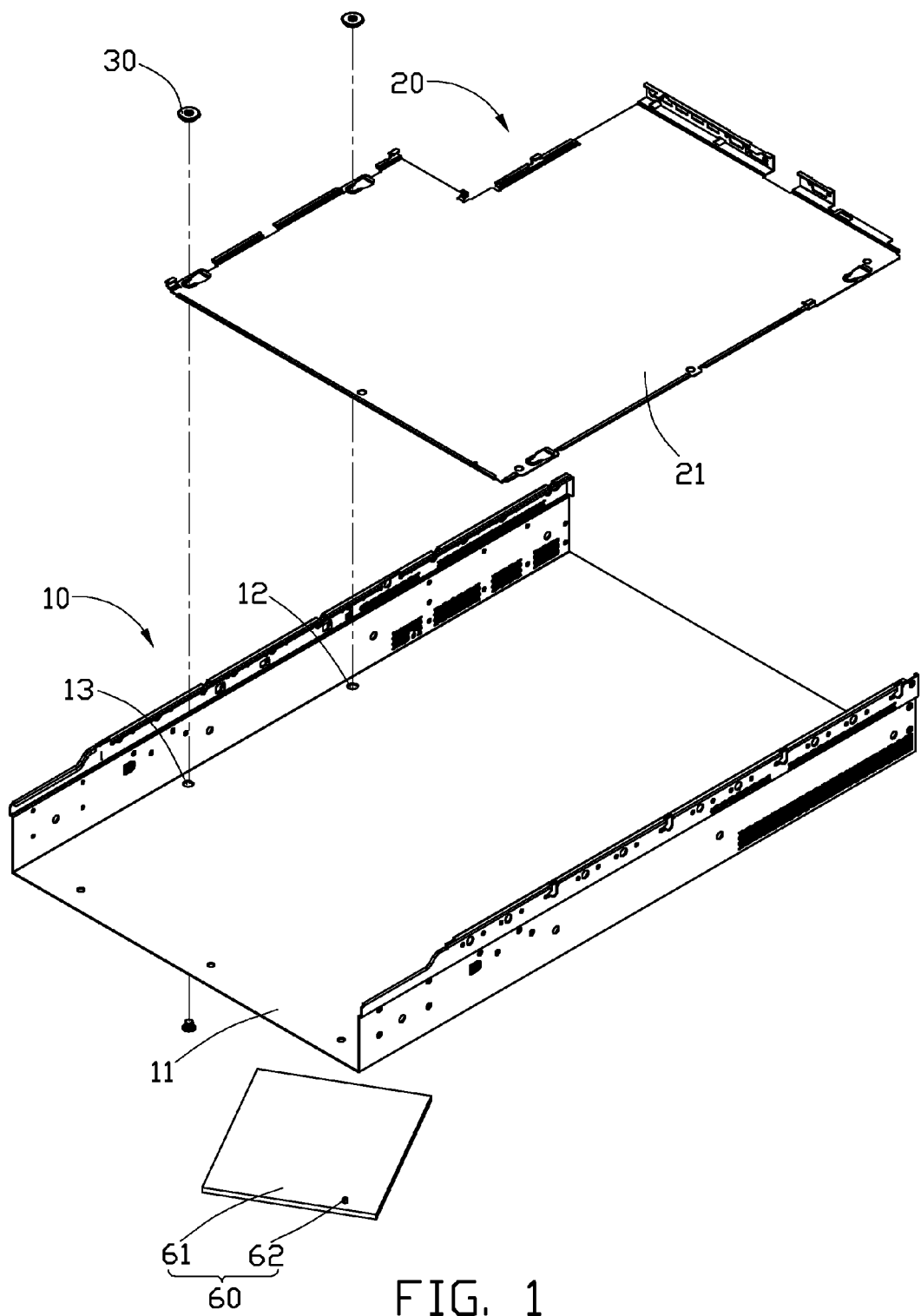
FIG. 1 is an exploded, isometric view of an embodiment of a mounting apparatus for a circuit board.
Figure 2:
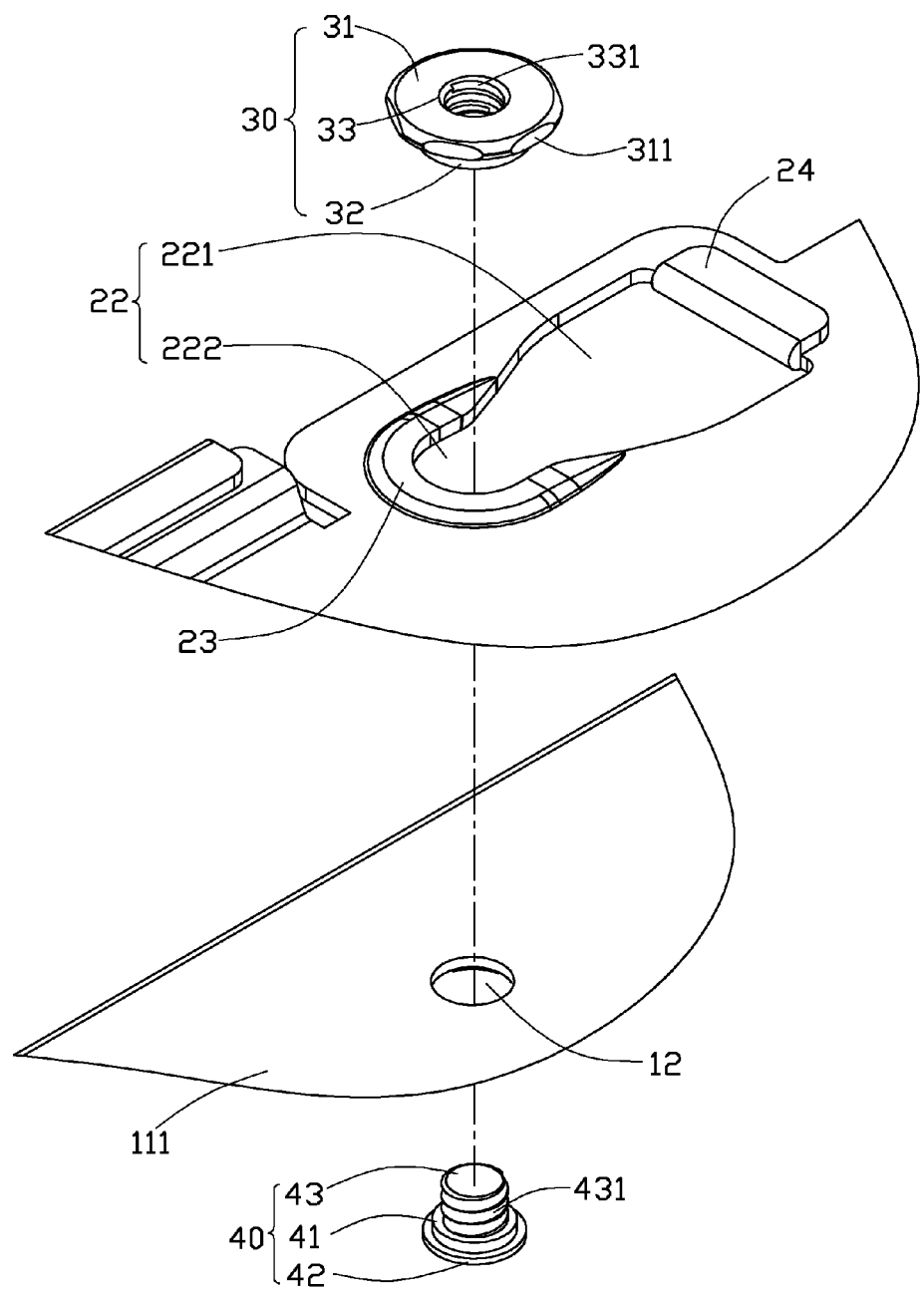
FIG. 2 is a partially enlarged, isometric view of the first fixing member, the fixing slot, the first through hole and the second fixing member of FIG. 1.
Figure 3:
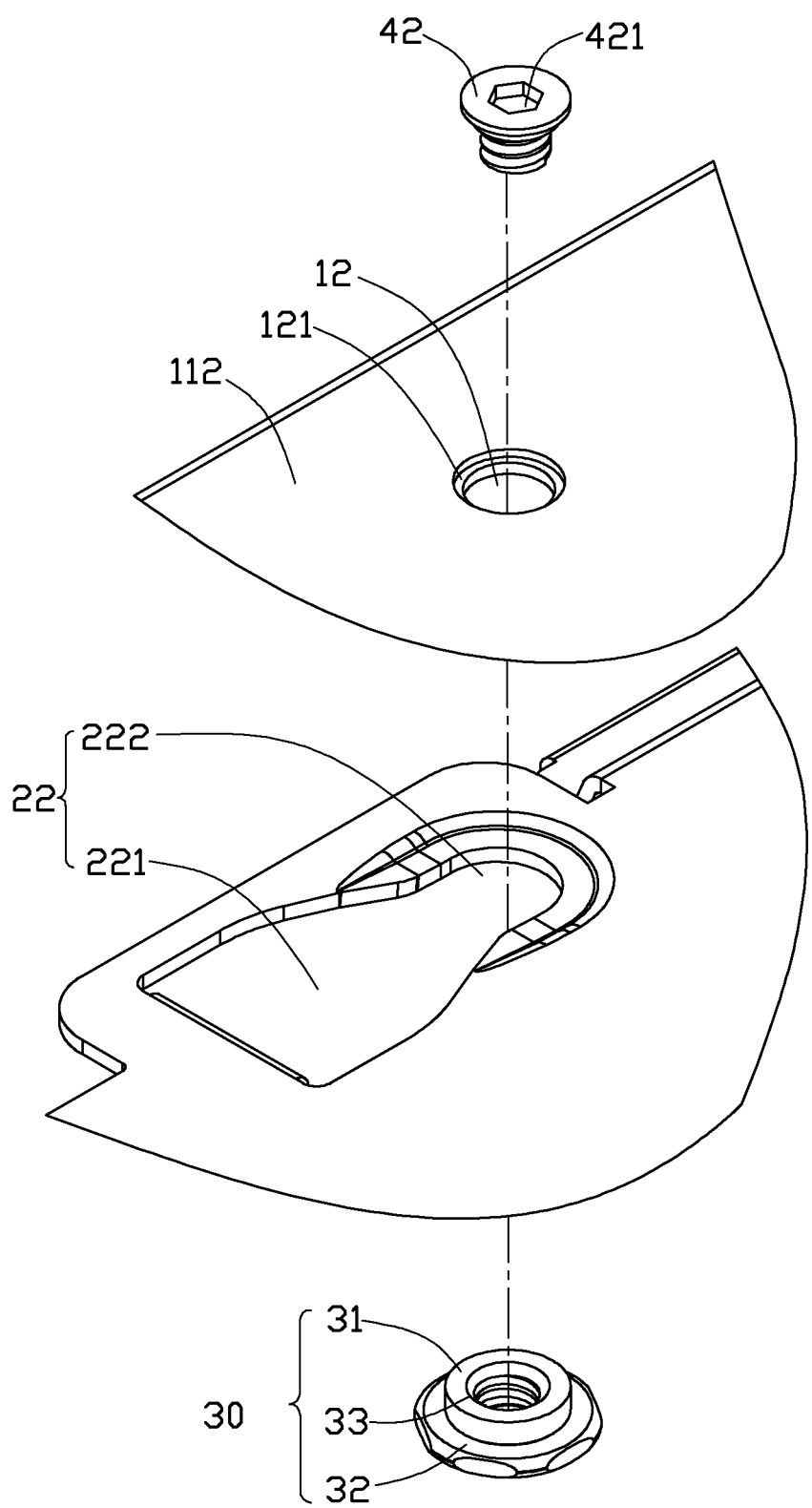
FIG. 3 is a partially enlarged, isometric view of the first fixing member, the fixing slot, the first through hole and the second fixing member of FIG. 1, viewed from another aspect.
Figure 4:
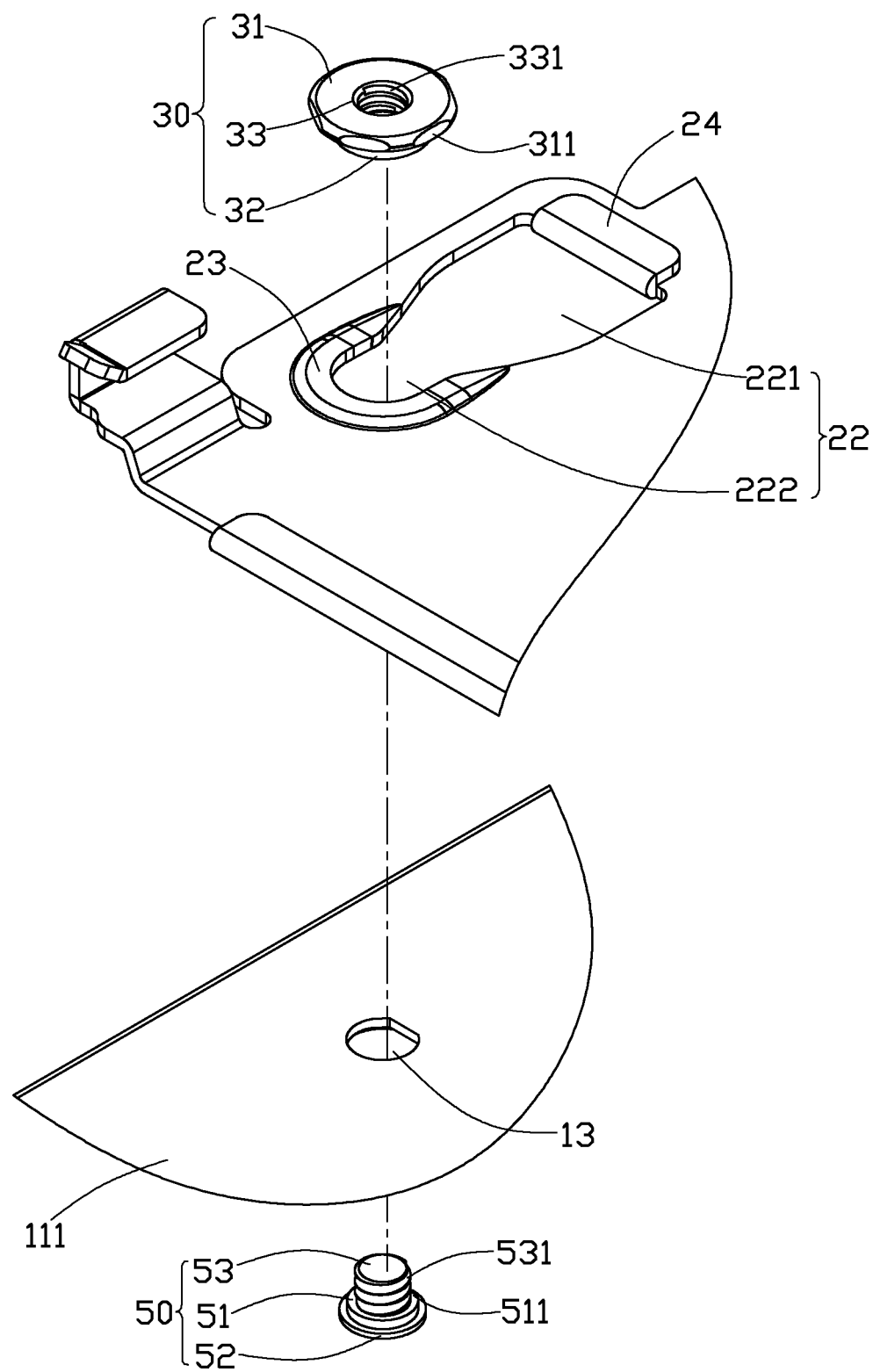
FIG. 4 is a partially enlarged, isometric view of the first fixing member, the fixing slot, the second through hole and the third fixing member of FIG. 1.
Figure 5:
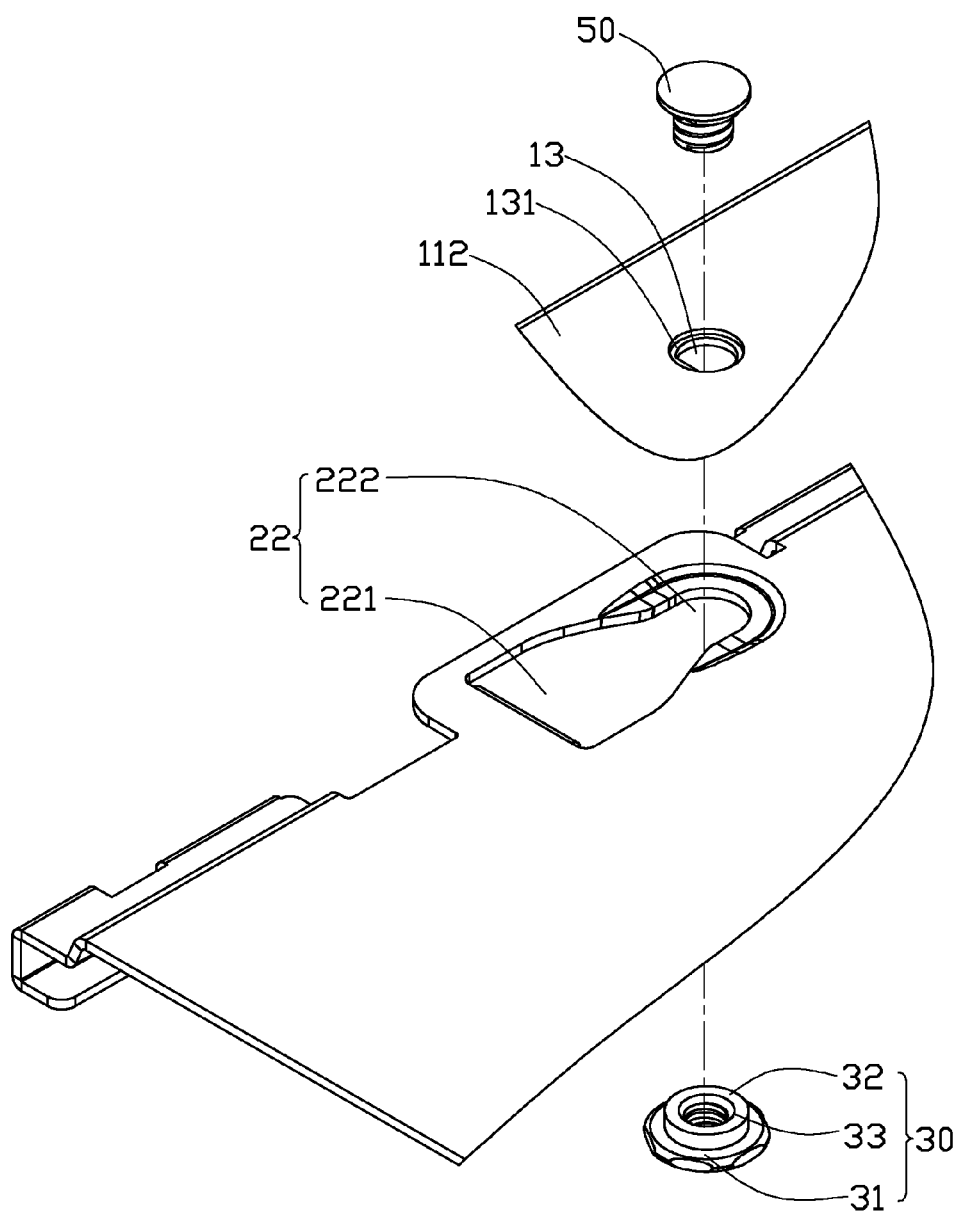
FIG. 5 is a partially enlarged, isometric view of the first fixing member, the fixing slot, the second through hole and the third fixing member of FIG. 1, viewed from another aspect.

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Referring to FIGS. 1-5, a mounting apparatus for fixing a circuit board 60, in accordance with an embodiment, includes an enclosure 10, a mounting board 20, two first mounting members 30, a second mounting member 40, and a third mounting member 50. In one embodiment, the mounting board 20 is mounted on the enclosure 10 by fastening members or riveting members.

The enclosure 10 comprises a bottom plate 11 having a top surface 111 and a bottom surface 112. The mounting board 20 contacts the top surface 111 when mounted on the enclosure 10. A circular first through hole 12 and a crown-shaped second through hole 13 are defined on the bottom plate 11. A ring-shaped first depressed portion 121 is defined around the first through hole 12 on the bottom surface 112. A ring-shaped second depressed portion 131 is defined around the second through hole 13 on the bottom surface 112.

The mounting board 20 comprises a mounting board body 21. Two fixing slots 22 are defined on the mounting board body 21 corresponding to the two first mounting members 30. Each of the two fixing slots 22 comprises an inserting slot 221 and a receiving slot 222 communicating with the inserting slot 221. An U-shaped protrusion flange 23 is formed on one side of the receiving slot 222. A handle 24 extends from a side edge of the receiving slot 222. In one embodiment, a thickness of the protrusion flange 23 is less than that of the mounting board body 21.

Each of the two first mounting members 30 comprises a fixing portion 31 and a securing portion 32 extends from a middle of the fixing portion 31. A plurality of blocking portions 311 are formed on an outer side of the fixing portion 31, for facilitating the rotation of the fixing portion 31. A fixing hole 33 is defined on the securing portion 32. A plurality of inner thread portions 331 are formed on an inner side of the fixing hole 33. The fixing hole 33 passes through the fixing portion 31 and the securing portion 32. In one embodiment, a cross-sectional area of the fixing portion 31 is greater than that of the receiving slot 222. A cross-sectional area of the securing portion 32 is less than that of the receiving slot 222.

The second mounting member 40 comprises a first connection portion 41, a first position portion 42 extending from a bottom of the first connection portion 41, and a first mounting portion 43 extending from a top of the first connection portion 41. The first connection portion 41 is received in the first through hole 12. A polygon-shaped position slot 421 is defined in the first position portion 42. The first position portion 42 is received in the first depressed portion 121, for preventing the first position portion 42 rotating relative to the bottom plate 11. A plurality of first outer thread portions 431 are formed on an outer side of the first mounting portion 43, for engaging with the plurality of inner thread portions 331. In one embodiment, the polygon-shaped position slot 421 is hexagon-shaped. A thickness of the first position portion 42 is equal to that of the first depressed portion 121.

The third mounting member 50 comprises a second connection portion 51, a second position portion 52 extends from a bottom of the second connection portion 51, and a second mounting portion 53 extends from a top of the second connection portion 51. The second connection portion 51 is received in the second through hole 13. A rectangular cross-section 511 is formed on one end of the second connection portion 51, for preventing the second connection portion 51 rotating in the second through hole 13. The second position portion 52 is received in the second depressed portion 131, for preventing the second position portion 52 rotating relative to the bottom plate 11. A plurality of second outer thread portions 531 are formed on an outer side of the second mounting portion 53, for engaging with the plurality of inner thread portions 331. In one embodiment, the polygon-shaped position slot 421 is hexagon-shaped. A thickness of the second mounting portion 53 is equal to that of the second depressed portion 131.

The circuit board 60 comprises a circuit board body 61 and a polygon-shaped position block 62 extends from the circuit board body 61. The position block 62 engages with the position slot 421. In one embodiment, the polygon-shaped position block 62 is hexagon-shaped.

Figure 6:
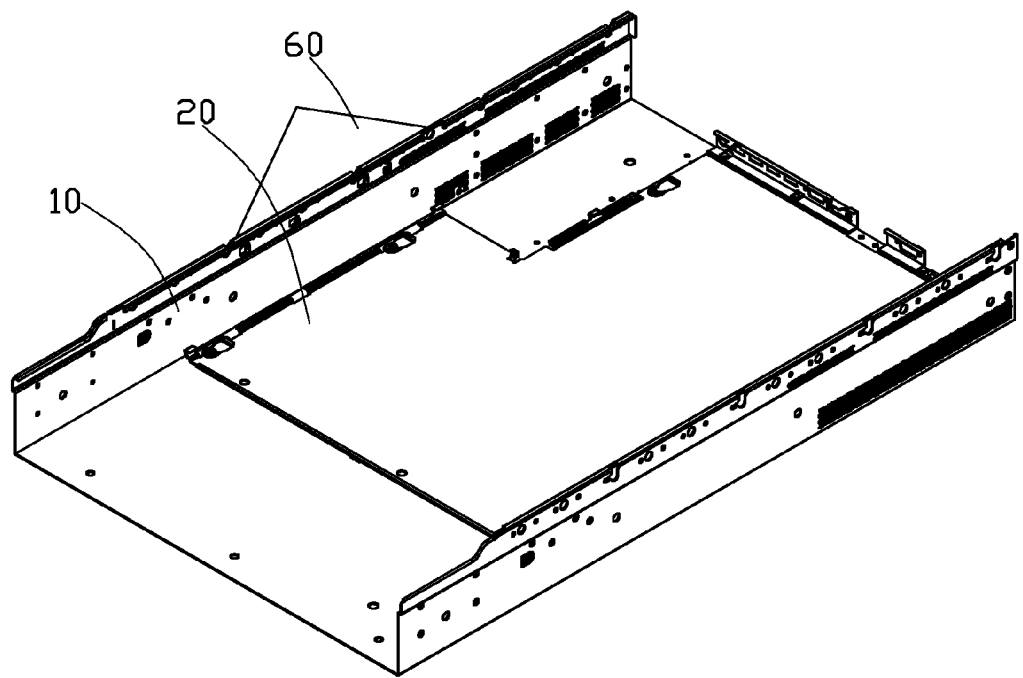
FIG. 6 is assembly view of the mounting apparatus of FIG. 1.

Referring to FIG. 6, in assembly, the first mounting portion 43 of the second mounting member 40 passes through the first through hole 12 on the bottom plate 11. The first connection portion 41 is positioned in the first through hole 12. The first position portion 42 is positioned in the first depressed portion 121 around the first through hole 12. The fixing hole 33 of each of the two first mounting members 30 is aligned with the first mounting portion 43 of the second mounting member 40. Each of the two first mounting members 30 is rotated to fix the first mounting portion 43 in the fixing hole 33. The plurality of first outer thread portions 431 engages the plurality of inner thread portions 331. The second mounting member 40 and each of the two first mounting members 30 are fixed on the enclosure 10. The securing portion 32 resists the top surface 111 of the bottom plate 11. The securing portion 32 is positioned between the top surface 111 and the fixing portion 31. The position block 62 engages the position slot 421 to fix the circuit board 60 on the enclosure 10.

The second mounting portion 53 of the third mounting member 50 passes through the second through hole 13 on the bottom plate 11. The second connection portion 51 is positioned in the second through hole 13. The second position portion 52 is positioned in the second depressed portion 131 around the second through hole 13. The fixing hole 33 of each of the two first mounting members 30 is aligned with the second mounting portion 53 of the third mounting member 50. Each of the two first mounting members 30 is rotated to fix the second mounting portion 53 in the fixing hole 33. The plurality of second outer thread portions 531 engage the plurality of inner thread portions 331. The third mounting member 50 and each of the two first mounting members 30 are fixed on the enclosure 10. The securing portion 32 resists the top surface 111 of the bottom plate 11. The securing portion 32 is positioned between the top surface 111 and the fixing portion 31.

The mounting board 20 is positioned on the top surface 111 of the bottom plate 11. The fixing portion 31 passes through the inserting slot 221 in each of the two fixing slots 22. The mounting board 20 is moved on the bottom plate 11 along a first direction. The securing portion 32 of each of the two first mounting members 30 slides in the receiving slot 222 from the inserting slot 221. The fixing portion 31 of each of the two first mounting members 30 resists the protrusion flange 23 of the mounting board 20. The mounting board 20 is fixed on the bottom plate 11. In disassembly, the mounting board 20 is moved on the bottom plate 11 along a second direction opposite to the first direction. The fixing portion 31 of each of the two first mounting members 30 disengages the protrusion flange 23 of the mounting board 20. The fixing portion 31 and the securing portion 32 of each of the two first mounting members 30 are positioned in the inserting slot 221 of each of the two fixing slots 22. The mounting board 20 is disassembled from the bottom plate 11.

Even though numerous characteristics and advantages of the present disclosure have been set forth in the foregoing description, together with details of the structure and function of the disclosure, the disclosure is illustrative only, and changes may be made in detail, especially in the matters of shape, size, and arrangement of parts within the principles of the disclosure to the full extent indicated by the broad general meaning of the terms in which the appended claims are expressed.

What is claimed is:

1. A mounting apparatus assembly, comprising:
   a circuit board comprising a position block;
   an enclosure comprising a bottom plate, a first through hole defined on the bottom plate, and a first depressed portion defined around the first through hole;
   at least one first mounting member comprising a first securing portion, and a first fixing hole defined on the first securing portion; and
   a second mounting member comprising a first position portion and a first mounting portion, and a position slot defined in the first position portion; wherein the first position portion is received in the first depressed portion to prevent the first position portion from rotating relative to the bottom plate; the first mounting portion passes through the first through hole to be fixed in the first fixing hole; the bottom plate is fixed between the first securing portion and the first position portion; and the position block engages the position slot to fix the circuit board on the enclosure; the at least one first mounting member further comprising a first fixing portion extending from a top of the first securing portion; the fixing portion resists a mounting board fixed on the bottom plate; the mounting board comprises a mounting board body, and two fixing slots defined on the mounting board body; each of the two fixing slots comprises an inserting slot and a receiving slot; the first fixing portion passes through the inserting slot to move the mounting board on the bottom plate along a first direction; and the first securing portion slides in the receiving slot to fix the mounting board on the bottom plate.

2. The mounting apparatus assembly of claim 1, wherein a protrusion flange is formed on one side of the receiving slot; the fixing portion resists the protrusion flange to fix the mounting board on the bottom plate; and a thickness of the protrusion flange is less than a thickness of the mounting board body.

3. The mounting apparatus assembly of claim 2, wherein a cross-sectional area of the fixing portion is greater than a cross-sectional area of the receiving slot; and a cross-sectional area of the first securing portion is less than the cross-sectional area of the receiving slot.

4. The mounting apparatus assembly of claim 3, further comprising a third mounting member and another first mounting member; a second through hole is defined on the bottom plate; a second depressed portion is defined around the second through hole on the bottom plate; the third mounting member comprises a second position portion, a second mounting portion, and a second connection portion between the second position portion and the second mounting portion; the another first mounting member comprises a second securing portion, and a second fixing hole defined on the securing portion; the second connection portion is received in the second through hole; the second position portion is received in the second depressed portion to prevent the second position portion from rotating relative to the bottom plate; and the second mounting portion passes through the second through hole to be fixed in the second fixing hole.

5. The mounting apparatus assembly of claim 4, wherein a rectangular cross-section is formed on one end of the second connection portion; and the rectangular cross-section prevents the second connection portion from rotating in the second through hole.

6. The mounting apparatus assembly of claim 4, wherein a plurality of inner threads are formed on an inner side of the fixing hole; a plurality of first outer threads are formed on an outer side of the first mounting portion; a plurality of second outer threads are formed on an outer side of the second mounting portion; the plurality of first outer threads engage the plurality of inner threads on a first one of the at least one first mounting member; the plurality of second outer threads engage the plurality of inner threads on a second one of the at least one first mounting member; the second mounting member engages the first one of the at least one first mounting member; and the third mounting member engages the second one of the at least one first mounting member.

7. The mounting apparatus assembly of claim 1, wherein the second mounting member further comprises a first connection portion between the first position portion and the first mounting portion; and the first connection portion is received in the first through hole.

8. The mounting apparatus assembly of claim 1, wherein the position block of the circuit board and the position slot of the second mounting member are hexagon-shaped.

9. A mounting apparatus for fixing a circuit board having a position block, comprising:
an enclosure comprising a bottom plate, a first through hole defined on the bottom plate, and a first depressed portion defined around the first through hole;
at least one first mounting member comprising a first securing portion, and a first fixing hole defined on the first securing portion; and
a second mounting member comprising a first position portion and a first mounting portion, and a position slot defined in the first position portion; wherein the first position portion is received in the first depressed portion to prevent the first position portion from rotating relative to the bottom plate; the first mounting portion passes through the first through hole to be fixed in the first fixing hole; the bottom plate is fixed between the first securing portion and the first position portion; and the position block engages the position slot to fix the circuit board on the enclosure; the at least one first mounting member further comprising a first fixing portion extending from a top of the first securing portion; the fixing portion resists a mounting board fixed on the bottom plate; the mounting board comprises a mounting board body, and two fixing slots defined on the mounting board body; each of the two fixing slots comprises an inserting slot and a receiving slot; the first fixing portion passes through the inserting slot to move the mounting board on the bottom plate along a first direction; and the first securing portion slides in the receiving slot to fix the mounting board on the bottom plate.

10. The mounting apparatus of claim 9, wherein a protrusion flange is formed on one side of the receiving slot; the fixing portion resists the protrusion flange to fix the mounting board on the bottom plate; and a thickness of the protrusion flange is less than a thickness of the mounting board body.

11. The mounting apparatus of claim 10, wherein a cross-sectional area of the fixing portion is greater than a cross-sectional area of the receiving slot; and a cross-sectional area of the first securing portion is less than the cross-sectional area of the receiving slot.

12. The mounting apparatus of claim 11, further comprising a third mounting member and the at least one first mounting member comprises at least two first mounting members; a second through hole is defined on the bottom plate; a second depressed portion is defined around the second through hole on the bottom plate; the third mounting member comprises a second position portion, a second mounting portion, and a second connection portion between the second position portion and the second mounting portion; each of the at least two first mounting members comprises a second securing portion, and a second fixing hole defined on the securing portion; the second connection portion is received in the second through hole; the second position portion is received in the second depressed portion to prevent the second position portion from rotating relative to the bottom plate; and the second mounting portion passes through the second through hole to be fixed in the second fixing hole.

13. The mounting apparatus of claim 12, wherein a rectangular cross-section is formed on one end of the second connection portion; and the rectangular cross-section prevents the second connection portion from rotating in the second through hole.

14. The mounting apparatus of claim 12, wherein a plurality of inner threads are formed on an inner side of the fixing hole; a plurality of first outer threads are formed on an outer side of the first mounting portion; a plurality of second outer threads are formed on an outer side of the second mounting portion; the plurality of first outer threads engage the plurality of inner threads on a first one of the at least two first mounting members; the plurality of second outer threads engage the plurality of inner threads on a second one of the at least two first mounting members; the second mounting member engages the first one of the at least two first mounting members; and the third mounting member engages the second one of the at least two first mounting members.

15. The mounting apparatus of claim 9, wherein the second mounting member further comprises a first connection portion between the first position portion and the first mounting portion; and the first connection portion is received in the first through hole.

16. The mounting apparatus of claim 9, wherein the position block of the circuit board and the position slot of the second mounting member are hexagon-shaped.

* * * * *